(12) United States Patent
Lee et al.

(10) Patent No.: US 9,874,666 B2
(45) Date of Patent: Jan. 23, 2018

(54) OPTICAL FILM INCLUDING PROTRUSIONS, DISPLAY DEVICE INCLUDING THE SAME AND METHOD OF MANUFACTURING OPTICAL FILM

(71) Applicants: SAMSUNG DISPLAY CO., LTD., Yongin, Gyeonggi-Do (KR); SEKONIX CO., LTD., Dongducheon-si, Gyeonggi-do (KR)

(72) Inventors: Duk Jin Lee, Yongin (KR); Nam Seok Baik, Yongin (KR); Jang Seok Ma, Yongin (KR); Jung Hee Son, Yongin (KR); Gyeong-Im Lee, Yongin (KR); Jung Chul Seo, Yongin (KR); Seok Il Yoon, Yongin (KR); Chan Hee Lee, Yongin (KR)

(73) Assignees: SAMSUNG DISPLAY CO., LTD., Yongin, Gyeonggi-Do (KR); SEKONIX CO., LTD, Dongducheon-Si, Kyunggi-Do (KR)

( * ) Notice: Subject to any disclaimer, the term of this patent is extended or adjusted under 35 U.S.C. 154(b) by 507 days.

(21) Appl. No.: 14/323,379

(22) Filed: Jul. 3, 2014

(65) Prior Publication Data
US 2015/0043221 A1 Feb. 12, 2015

(30) Foreign Application Priority Data

Aug. 8, 2013 (KR) .......................... 10-2013-0094421

(51) Int. Cl.
*G02B 5/02* (2006.01)
*H01L 51/52* (2006.01)

(52) U.S. Cl.
CPC ......... *G02B 5/0273* (2013.01); *G02B 5/0236* (2013.01); *G02B 5/021* (2013.01); *H01L 51/5275* (2013.01); *Y10T 428/24612* (2015.01)

(58) Field of Classification Search
CPC ...... G02B 5/02; G02B 5/0205; G02B 5/0215; G02B 5/0221; G02B 5/0231;
(Continued)

(56) References Cited

U.S. PATENT DOCUMENTS

2003/0048400 A1 3/2003 Kim et al.
2010/0110551 A1 5/2010 Lamansky et al.
(Continued)

FOREIGN PATENT DOCUMENTS

CN 101055325 A 10/2007
CN 102742352 A 10/2012
(Continued)

OTHER PUBLICATIONS

Taiwanese Office Action dated Nov. 28, 2017 for corresponding Taiwanese Patent Application No. 103127067.

*Primary Examiner* — Arnel C Lavarias
(74) *Attorney, Agent, or Firm* — Lee & Morse, P.C.

(57) ABSTRACT

An optical film, a display device including the same, and a method of manufacturing the optical film, the film including a first refractive index layer including a plurality of protrusions; a second refractive index layer covering the plurality of protrusions, the second refractive index layer having a refractive index that is different from a refractive index of the first refractive index layer; and a support layer on the first refractive index layer or the second refractive index layer, wherein a ratio of a height to a width of the protrusion is 0.5 or more.

18 Claims, 19 Drawing Sheets

(58) Field of Classification Search
CPC .. G02B 5/0263; G02B 5/0273; G02B 5/0278; G02B 6/0001; G02B 6/0025; G02B 6/0051; G02B 6/0053; G02B 6/0036; G02B 6/0038; G02B 6/004; G02B 6/0043; G02F 1/1336; G02F 1/133606; G02F 1/133607; G02F 1/133611
USPC ........ 359/599, 601, 609, 613; 362/600, 606, 362/607, 608, 615, 618, 619, 620, 622, 362/627, 628
See application file for complete search history.

(56) References Cited

U.S. PATENT DOCUMENTS

| | | | |
|---|---|---|---|
| 2011/0013269 A1* | 1/2011 | Ogawa | G02B 6/12007 359/341.1 |
| 2012/0286258 A1* | 11/2012 | Naraoka | C09K 11/06 257/40 |
| 2016/0077248 A1* | 3/2016 | Shim | H01L 51/5275 257/40 |

FOREIGN PATENT DOCUMENTS

| | | |
|---|---|---|
| CN | 102809774 A | 12/2012 |
| JP | 2001-183524 A | 7/2001 |
| JP | 2004-039272 A | 2/2004 |
| JP | 2012-507831 A | 3/2012 |
| KR | 10-2014-0081653 A | 7/2004 |
| KR | 10-0450714 B1 | 9/2004 |
| KR | 10-0450715 B1 | 9/2004 |
| KR | 10-0460787 B1 | 12/2004 |
| KR | 10-0466039 B1 | 1/2005 |
| KR | 10-0470321 B1 | 1/2005 |
| KR | 10-0470323 B1 | 1/2005 |
| KR | 10-0470324 B1 | 1/2005 |
| KR | 10-0563472 B1 | 3/2006 |
| KR | 10-0655087 B1 | 12/2006 |
| KR | 10-0673034 B1 | 1/2007 |
| KR | 10-0673041 B1 | 1/2007 |
| KR | 10-2009-0120956 A | 11/2009 |
| KR | 10-2010-0013046 A | 2/2010 |
| KR | 10-0971719 B1 | 7/2010 |
| KR | 10-0976808 B1 | 8/2010 |
| KR | 10-0995580 B1 | 11/2010 |
| KR | 10-1088647 B1 | 11/2011 |
| KR | 10-1141968 B1 | 4/2012 |
| KR | 10-1141969 B1 | 4/2012 |
| KR | 10-2012-0119672 A | 10/2012 |
| KR | 10-1187748 B1 | 10/2012 |
| KR | 10-1187750 B1 | 10/2012 |
| KR | 10-1187751 B1 | 10/2012 |
| KR | 10-1273272 B1 | 6/2013 |
| KR | 10-1278347 B1 | 6/2013 |
| TW | 201300221 A | 1/2013 |
| WO | WO 2012/039359 A1 | 3/2012 |

* cited by examiner

FIG. 3

| Classification | Shape structure | Merit |
|---|---|---|
| Linear | | ✓ Color improvement at left, right, upper, and lower portions |
| Diagonal | | |
| Intaglioed | | ✓ Easiness of low refractive filling<br>✓ Longitudinal direction production |
| Diffusion material | | ✓ Structure to which diffusion agent is applied |

FIG. 19
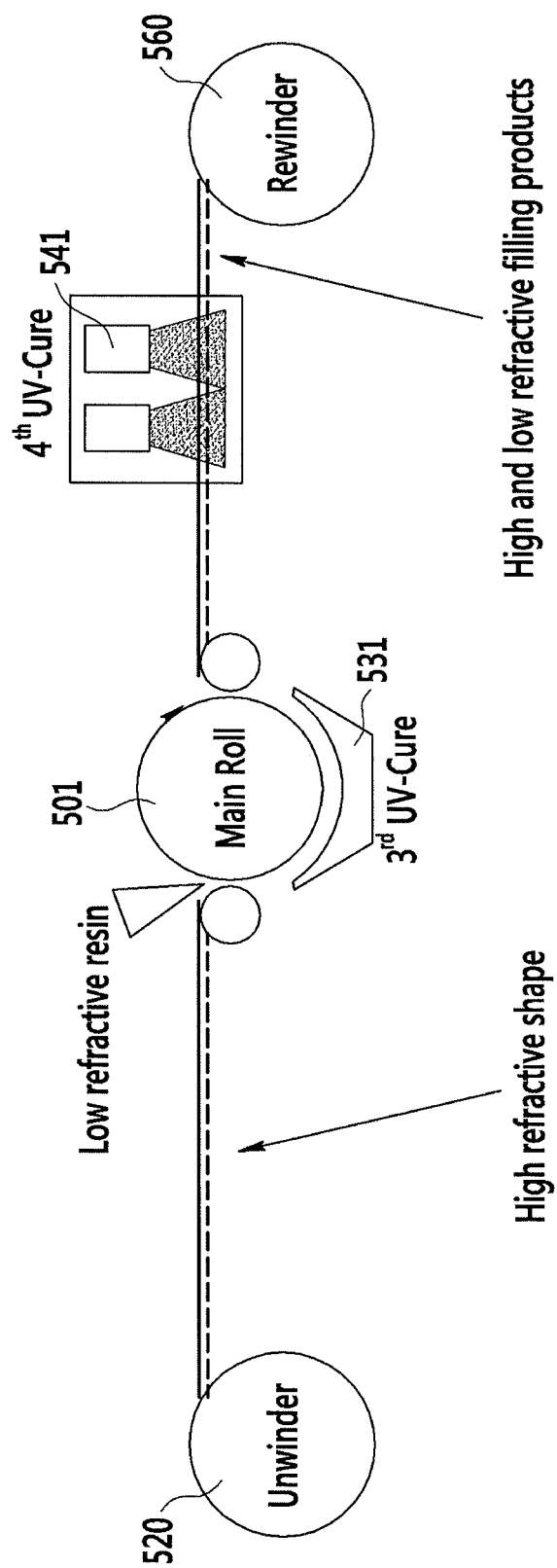
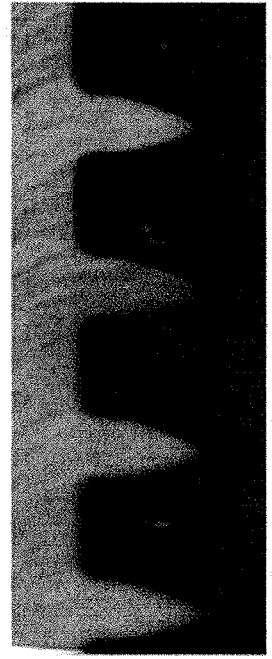
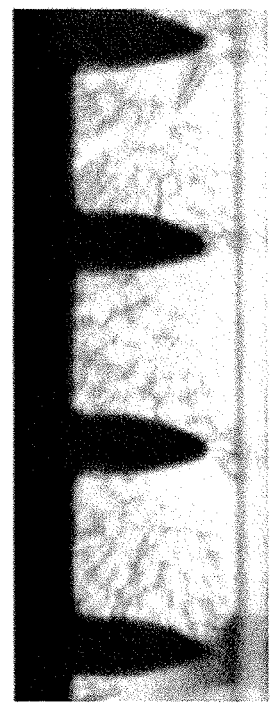

OPTICAL FILM INCLUDING PROTRUSIONS, DISPLAY DEVICE INCLUDING THE SAME AND METHOD OF MANUFACTURING OPTICAL FILM

CROSS-REFERENCE TO RELATED APPLICATION

Korean Patent Application No. 10-2013-0094421, filed on Aug. 8, 2013, in the Korean Intellectual Property Office, and entitled: "Optical Film, Display Device Including The Same and Method Of Manufacturing Optical Film," is incorporated by reference herein in its entirety.

BACKGROUND

1. Field

Embodiments relate to an optical film, a display device including the same, and a method of manufacturing the optical film.

2. Description of the Related Art

A display field has been rapidly developed as various information transfer means in modernized society. Recently, many technical challenges have been made in terms of a weight and a thickness of a display and challenges to escape from flat-panel light emission of the display.

Among flat panel displays, recently, a liquid crystal display (LCD) has been most widely used. The liquid crystal display is a non-emissive display device, and a separate light source such as a backlight is required.

Recently, an organic light emitting diode (OLED) that is a self-luminous display device has received attention. The organic light emitting diode may include two electrodes facing each other, and an organic layer interposed between the electrodes. In the organic light emitting diode, if holes injected from an anode and electrons injected from a cathode meet each other at a light emitting layer to generate an exciton, and the exciton is subjected to photo-luminescence quenching, light may be generated. The organic light emitting diode may be applied to various fields including a display device and a lighting device.

The above information disclosed in this Background section is only for enhancement of understanding of the background of the invention and therefore it may contain information that does not form the prior art that is already known in this country to a person of ordinary skill in the art.

SUMMARY

Embodiments are directed to an optical film, a display device including the same, and a method of manufacturing the optical film.

The embodiments may be realized by providing an optical film including a first refractive index layer including a plurality of protrusions; a second refractive index layer covering the plurality of protrusions, the second refractive index layer having a refractive index that is different from a refractive index of the first refractive index layer; and a support layer on the first refractive index layer or the second refractive index layer, wherein a ratio of a height to a width of the protrusion is 0.5 or more.

A difference between the refractive index of the first refractive index layer and the refractive index of the second refractive index layer may be 0.2 or less.

A density of the plurality of protrusions may be 90% or less.

A higher refractive index layer of the first refractive index layer and the second refractive index layer may include about 20 to about 50% of epoxy acrylate, about 50 to about 80% of an acrylate monomer, and about 1 to about 6% of a photoinitiator, and a lower refractive index layer of the first refractive index layer and the second refractive index layer may include about 20 to about 60% of fluorine urethane acrylate, about 20 to about 60% of a fluorine acrylate monomer, about 10 to about 40% of an acrylate monomer, and about 1 to about 6% of a photoinitiator.

Each protrusion may have a shape of any one of a polygon, a circle, an oval, a quadrangle, a rhombus, or a diamond.

The plurality of protrusions may further include a connection portion connecting the plurality of protrusions.

At least one of the first refractive index layer or the second refractive index layer may further include a diffusion agent.

The embodiments may be realized by providing a display device including a display panel; and an optical film on an entire surface of the display panel, wherein the optical film includes a first refractive index layer including a plurality of protrusions; a second refractive index layer covering the plurality of protrusions, the second refractive index layer having a refractive index that is different from a refractive index of the first refractive index layer; and a support layer outside the first refractive index layer or the second refractive index layer, and wherein a ratio of a height to a width of the protrusion is 0.5 or more.

A difference between the refractive index of the first refractive index layer and the refractive index of the second refractive index layer may be 0.2 or less.

A density of the plurality of protrusions may be 90% or less.

A higher refractive index layer of the first refractive index layer and the second refractive index layer may include about 20 to about 50% of epoxy acrylate, about 50 to about 80% of an acrylate monomer, and about 1 to about 6% of a photoinitiator, and a lower refractive index layer of the first refractive index layer and the second refractive index layer may include about 20 to about 60% of fluorine urethane acrylate, about 20 to about 60% of a fluorine acrylate monomer, about 10 to about 40% of an acrylate monomer, and about 1 to about 6% of a photoinitiator.

Each protrusion may have a shape of any one of a polygon, a circle, an oval, a quadrangle, a rhombus, or a diamond.

The plurality of protrusions may further include a connection portion connecting the plurality of protrusions.

At least one of the first refractive index layer or the second refractive index layer may further include a diffusion agent.

In the display panel, each pixel may include an organic emission layer, and the organic emission layer may emit light of any one of three primary colors of light.

The embodiments may be realized by providing a method of manufacturing an optical film, the method including forming a high refractive index layer in which a plurality of protrusions is intaglioed by providing a high refractive index resin to a soft mold in which the plurality of protrusions is formed; and forming a low refractive index layer by providing a low refractive index resin to the intaglioed plurality of protrusions to perform filling, wherein a ratio of a height to a width of the protrusion is 0.5 or more.

The method may further include forming a support layer on the high refractive index layer or the low refractive index layer.

In the forming of the high refractive index layer, the plurality of protrusions may be intaglioed in the high refractive index resin by the soft mold in a state where the support layer is formed on one surface of the high refractive index resin.

BRIEF DESCRIPTION OF THE DRAWINGS

Features will be apparent to those of skill in the art by describing in detail exemplary embodiments with reference to the attached drawings in which:

FIGS. 3, 4A, and 4B illustrate top plan views of the optical films according to various exemplary embodiments.

FIGS. 18 and 19 illustrate views sequentially showing a process of manufacturing the optical film according to the exemplary embodiment.

DETAILED DESCRIPTION

Figure 1:
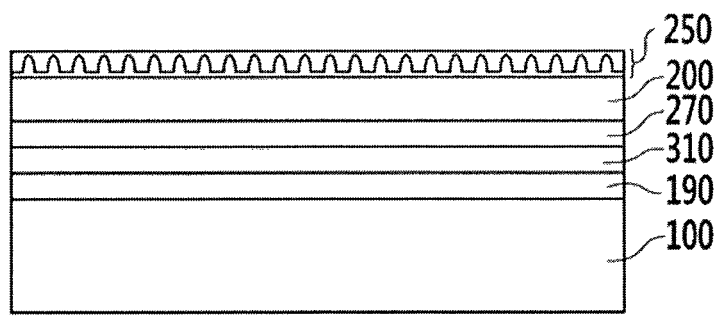
FIG. 1 illustrates a cross-sectional view of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, a display device according to an exemplary embodiment will be described in detail with reference to FIG. 1.

FIG. 1 illustrates a cross-sectional view of a display device according to an exemplary embodiment.

The display device of FIG. 1 is an organic light emitting diode display. The organic light emitting diode display of FIG. 1 may include a lower substrate 100, a pixel electrode 190 positioned thereon, an organic emission layer 310 positioned on the pixel electrode 190, a common electrode 270 positioned on the organic emission layer 310, a capping glass 200 positioned on the common electrode 270, and an optical film 250 on the capping glass 200. Herein, the lower substrate 100, the pixel electrode 190, the organic emission layer 310, the common electrode 270, and the capping glass 200 may be referred to as a display panel.

A structure of FIG. 1 is a schematically illustrated structure, and the organic light emitting diode display according to the exemplary embodiment may have various structures. In an implementation, the optical film 250 according to the exemplary embodiment may be attached to an entire surface of the capping glass 200 that is an upper glass to help reduce a difference between luminances and to help reduce a difference between colors of a front surface and upper, lower, left, and right portions.

In the organic light emitting diode display according to an embodiment, the organic emission layer 310 may emit light of, e.g., any one of three primary colors or light of a white color. In the case where light of the white color is emitted, a color filter may be further included.

The optical film 250 according to an embodiment may have greater effects in the case where the organic emission layer 310 emits light of any one of the three primary colors, as compared to the case where the organic emission layer 310 emits light of the white color. This may be because in an organic light emitting diode display emitting light of any one of the three primary colors, there may be many changes in luminance and color at a lateral surface.

Further, according to the exemplary embodiment, in order to make the luminance or the color constant or uniform at the front surface and upper, lower, left, and right portions even in a flat display panel (e.g., a liquid crystal panel or the like) other than an organic light emitting panel, the optical film 250 according to the exemplary embodiment may be used.

In the optical film 250 according to an embodiment, one layer (of two layers having different refractive indexes) may include a protrusion pattern (a plurality of patterns), and the other layer may have a structure covering the protrusion pattern.

This will be described in detail through FIGS. 2 to 4.

Figure 2:
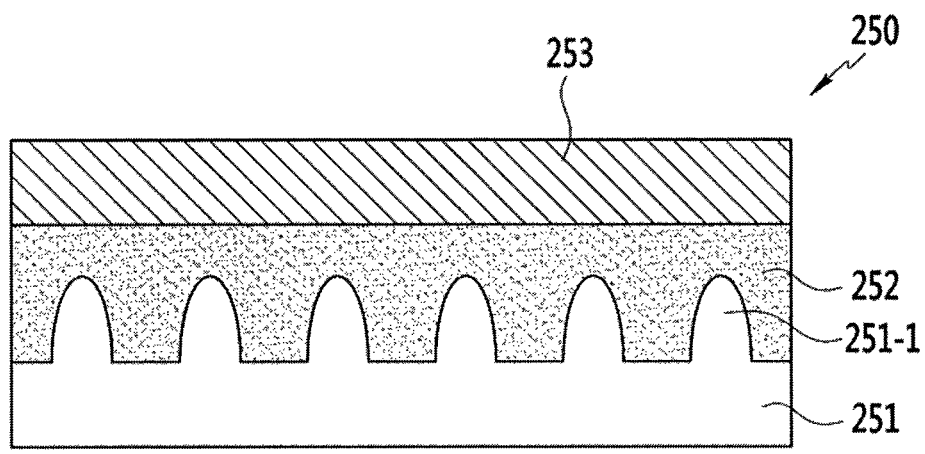
FIG. 2 illustrates a cross-sectional view of an optical film according to the exemplary embodiment.

FIG. 2 illustrates a cross-sectional view of the optical film according to the exemplary embodiment, and FIGS. 3 and 4 illustrate top plan views of the optical films according to various exemplary embodiments.

First, the structure of the optical film 250 will be described through FIG. 2.

The optical film 250 may include a support layer 253 (formed of or including a material such as TAC, PET, PC, acryl, or a glass), and a first refractive index layer 251 and a second refractive index layer 252 (having different refractive indexes from one another).

In an implementation, the protrusion pattern may be formed in or on the first refractive index layer 251, and the second refractive index layer 252 may have, e.g., an intaglio pattern corresponding to the protrusion pattern. The first refractive index layer 251 may be a layer having a relatively low refractive index (hereinafter, referred to as "low refractive index layer"), and the second refractive index layer 252 may be a layer having a relatively high refractive index (hereinafter, referred to as "high refractive index layer"). According to the exemplary embodiment, the highness and the lowness of the refractive index may be reversed, but hereinafter, the case where the first refractive index layer 251 is the low refractive index layer will be mainly described.

The first refractive index layer 251 and the second refractive index layer 252 may be formed of or may include resins having different refractive indexes, and may not include a layer such as air. Examples of suitable resins may include fluorine urethane acrylate, a fluorine acrylate monomer, an acrylate monomer, and epoxy acrylate. In an implementation, the layers and/or resins may further include, e.g., an additive and an initiator.

In an implementation, the high refractive index layer (e.g., the layer having the higher refractive index from among the first refractive index layer and the second refractive index layer) according to the exemplary embodiment may be formed from a composition including or may include, e.g., about 20 to about 50% of epoxy acrylate, about 50 to about 80% of the acrylate monomer, and about 1 to about 6% of the photoinitiator. In an implementation, the low refractive index layer (e.g., the layer having the lower refractive index from among the first refractive index layer and the second refractive index layer) according to an embodiment may be formed from a composition including or may include, e.g., about 20 to about 60% of fluorine urethane acrylate, about 20 to about 60% of the fluorine acrylate monomer, about 10 to about 40% of the acrylate monomer, and about 1 to about 6% of the photoinitiator.

The protrusion pattern in or on the first refractive index layer 251 may have a structure in which a plurality of protrusions 251-1 are arranged in at least two directions. In the cross-sectional view, an aspect ratio (ratio of a height to a width) of each protrusion may be 0.5 or more. When a bottom of each protrusion is oval-shaped, the width of the protrusion may be at least 2 different values. In this case, the width of the protrusion is selected as the narrowest value. This can also occur when the width has at least 2 values, regardless of the shape of the protrusion, but the selected width of the protrusion may be different. In addition, the widest width of the protrusion may be smaller than a length of a pixel. In the top plan view, a pattern density (e.g., a density occupied by the plurality of protrusions) may be 90% or less. Further, a difference between the refractive index of the first refractive index layer 251 and the refractive index of the second refractive index layer 252 may be 0.2 or less.

A plane structure of the optical film 250 having the aforementioned structure will be described through FIGS. 3 and 4.

First, the exemplary embodiment illustrated in FIG. 3 will be described.

FIG. 3 illustrates only the protrusion pattern protruding from the first refractive index layer 251 of the optical film 250.

In the protrusion pattern of the optical film 250 according to the exemplary embodiment, the protrusions may be arranged in at least two directions, and various exemplary embodiments may exist.

First, in FIG. 3, a striped (e.g., linear) arrangement exemplary embodiment, a diagonal exemplary embodiment where arrangement is performed in a diagonal direction, an intaglio type exemplary embodiment, and an exemplary embodiment using a diffusion material are illustrated.

First, the striped (e.g., linear) arrangement exemplary embodiment will be described.

The striped (e.g., linear) arrangement exemplary embodiment may have a structure where the plurality of protrusions having an oval structure are arranged in vertical and horizontal directions in a rear view. In the striped arrangement exemplary embodiment, a long axis direction and a short axis direction of the oval structure may be identical to arrangement directions of the protrusion pattern. The aspect ratio (ratio of a height to a width) of one protrusion may be 0.5 or more, and the pattern density may be 90% or less. In the striped arrangement exemplary embodiment, the protrusions may be evenly arranged in an oblique or zig-zag direction. For example, in the striped arrangement exemplary embodiment, the protrusions that are most closely adjacent to each other may be adjacent to each other in an oblique direction or in a zig-zag arrangement.

The diagonal exemplary embodiment may have a structure in which the plurality of protrusions having the oval structure is arranged in the vertical and horizontal directions in the rear view. In the diagonal exemplary embodiment, unlike the striped arrangement exemplary embodiment, the long axis direction and the short axis direction of the oval structure are not identical to the arrangement direction of the protrusion pattern. For example, in the diagonal arrangement, the long and/or short axes of the ovals may be offset by about 45 degrees relative to a vertical or horizontal arrangement direction of the protrusions. The aspect ratio (ratio of a height to a width) of one protrusion may be 0.5 or more, and the pattern density may be 90% or less.

In the aforementioned exemplary embodiments, the protrusion structure is illustrated to have the oval structure in the top plan view, but the protrusion structure may have various structures other than the oval structure. For example, the protrusion structure may have a shape of a polygonal structure, a circle, a quadrangle, a rhombus structure, or a triangle structure, or a structure where the polygonal structures or other shapes are connected to each other.

The intaglio type exemplary embodiment may be a case in which the intaglio pattern is formed in the first refractive index layer 251 and the protrusion pattern is formed in the second refractive index layer 252. The intaglio type exemplary embodiment may have the same protrusion pattern as the striped exemplary embodiment or the diagonal exemplary embodiment, but the protrusion pattern having the different structure is illustrated in FIG. 3. For example, the intaglio type exemplary embodiment may have a structure in which the protrusions having the circle or rhombus structure in the top plan view are arranged in the vertical and horizontal directions. In the intaglio type exemplary embodiment, a filling characteristic that the material having the low refractive index is filled between the protrusion patterns may be good. Further, in the intaglio type exemplary embodiment, the adjacent protrusions may be positioned in the vertical and horizontal directions. However, according to the exemplary embodiment, like the striped exemplary embodiment, the adjacent protrusions may be adjacent to each other in an oblique direction or a zig-zag arrangement.

According to an embodiment, at least one of the first refractive index layer 251 (e.g., low refractive index layer) and the second refractive index layer 252 (e.g., high refractive index layer) may further include a diffusion material. The diffusion material may help improve a diffusion characteristic of light to uniformly disperse light at a front surface and upper, lower, left, and right portions.

Hereinafter, more various exemplary embodiments will be described with reference to FIG. 4, e.g., FIGS. 4A and 4B.

First, FIG. 4A will be described.

Figure 4A:
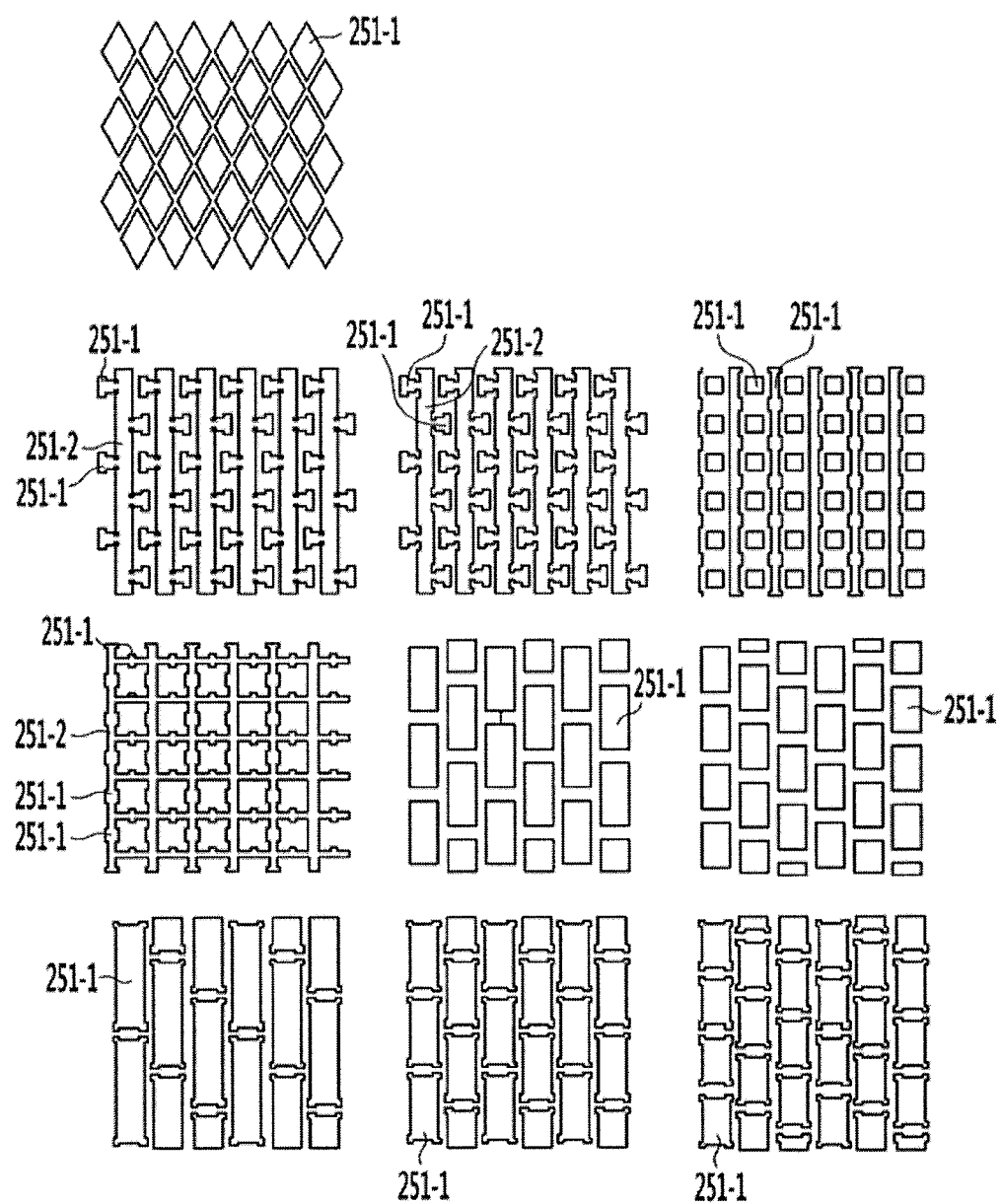

In FIG. 4A, in the top plan view, the protrusion structure having a diamond shape is illustrated, and the protrusions adjacent in the oblique direction are arranged to have sides parallel to each other. Further, the protrusions may be arranged in the vertical direction and the horizontal direction. Herein, the aspect ratio (ratio of a height to a width) of one protrusion may be 0.5 or more, and the pattern density may be 90% or less.

In FIG. 4A, embodiments including a connection portion 251-2 connecting the plurality of protrusions 251-1 to each other are illustrated. For example, an exemplary embodiment having a structure where the protrusions alternately protrude at a left side and a right side of a vertically arranged connection portion is illustrated. The structure of the protrusion in the rear view may include portions having different widths, and the protrusion has the structure where the width is increased as going away from the connection portion. In an implementation, the connection portion may have a straight line structure or a bent structure. In the embodiments including the connection portion, the corresponding structure may be arranged in only one direction when the structure where the connection portion and the protrusion are combined is considered as a basis. For example, the corresponding structure may be arranged in only left and right directions. However, the protrusion may be further included in the corresponding structure, and thus the corresponding structure may be a structure where the protrusions are arranged in at least two directions based on the protrusions and the connection portion connecting the protrusions is disposed. In an implementation, the structure may have the protrusion pattern including the protrusions arranged in two or more directions.

The structure may have the pattern including the plurality of protrusions and a separate straight line structure. For example, in FIG. 4A, the structure where the quadrangular protrusions are arranged in the vertical and horizontal directions and a linear pattern extends in the vertical direction between the plurality of protrusions is illustrated. Herein, the linear pattern may have a structure where a large width portion and a small width portion are alternately repeated. According to the exemplary embodiment, the linear pattern may have the straight line structure.

Further, in FIG. 4A, the exemplary embodiment having a structure in which the plurality of protrusions are connected to each other by a connection portion in the vertical direction and a connection portion in the horizontal direction is illustrated in the top plan view. The shapes and the sizes of the plurality of protrusions and the connection portion may be changed according to the position.

Further, the protrusion having a rectangular structure is illustrated in the top plan view, and the exemplary embodiment where an additional protrusion portion is formed at a corner portion of the rectangular structure is illustrated.

The optical film 250 may have other structures not illustrated in the drawings as well as the aforementioned various exemplary embodiments.

Figure 4B:
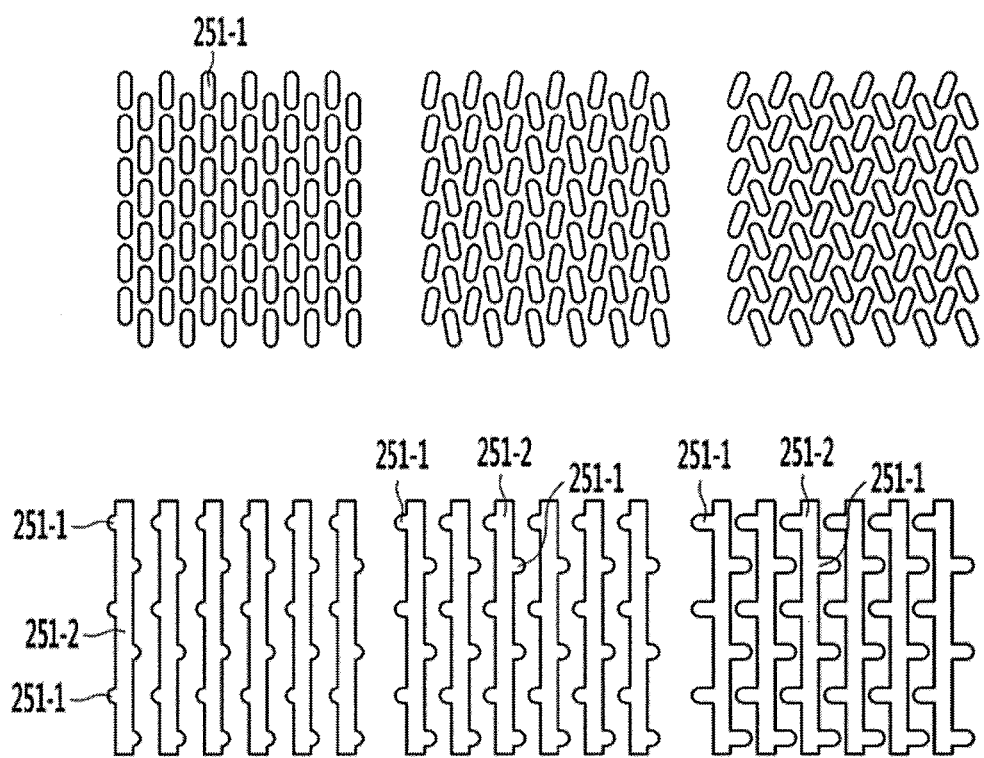

In FIG. 4B, the exemplary embodiments having different patterns by an angle or an interval even though the exemplary embodiments have the same structure will be described.

First, in a first row of FIG. 4B, the structure where the protrusions, in which upper and lower ends are rounded and sides in the vertical direction have the straight line structure, may be arranged while having different angles is illustrated. Formation of the different protrusion patterns by changing only the direction of each protrusion is illustrated.

In a second row of FIG. 4B, a change in pattern according to a width of the connection portion and a width of the protrusion protruding from the connection portion is illustrated. An example where an entire pattern is changed by changing a relative size is illustrated.

As described above, the optical film 250 including the protrusion patterns of various exemplary embodiments may be formed through various structures and arrangements. The optical film 250 according to the exemplary embodiment may have the following characteristic. The plurality of protrusions may be arranged in at least two directions. In the cross-sectional view, the aspect ratio (ratio of the height to the width) of one protrusion may be 0.5 or more. In the top plan view, the pattern density (e.g., the density occupied by the plurality of protrusions) may be 90% or less. Further, a difference between the refractive index of the first refractive index layer 251 and the refractive index of the second refractive index layer 252 may be 0.2 or less.

Further, in the cross-sectional view, one protrusion, as illustrated in FIG. 2, may be formed so that an end is rounded, but may have a structure having a corner at which an upper surface and a lateral surface vertically meet.

Hereinafter, the characteristic of the optical film according to the exemplary embodiment will be described with reference to FIGS. 5 to 16.

FIGS. 5 to 16 illustrate an effect of the optical film according to the exemplary embodiment. For example, FIGS. 5 to 16 represent calculated values for the described properties of the respective materials and/or layers.

Figure 5:
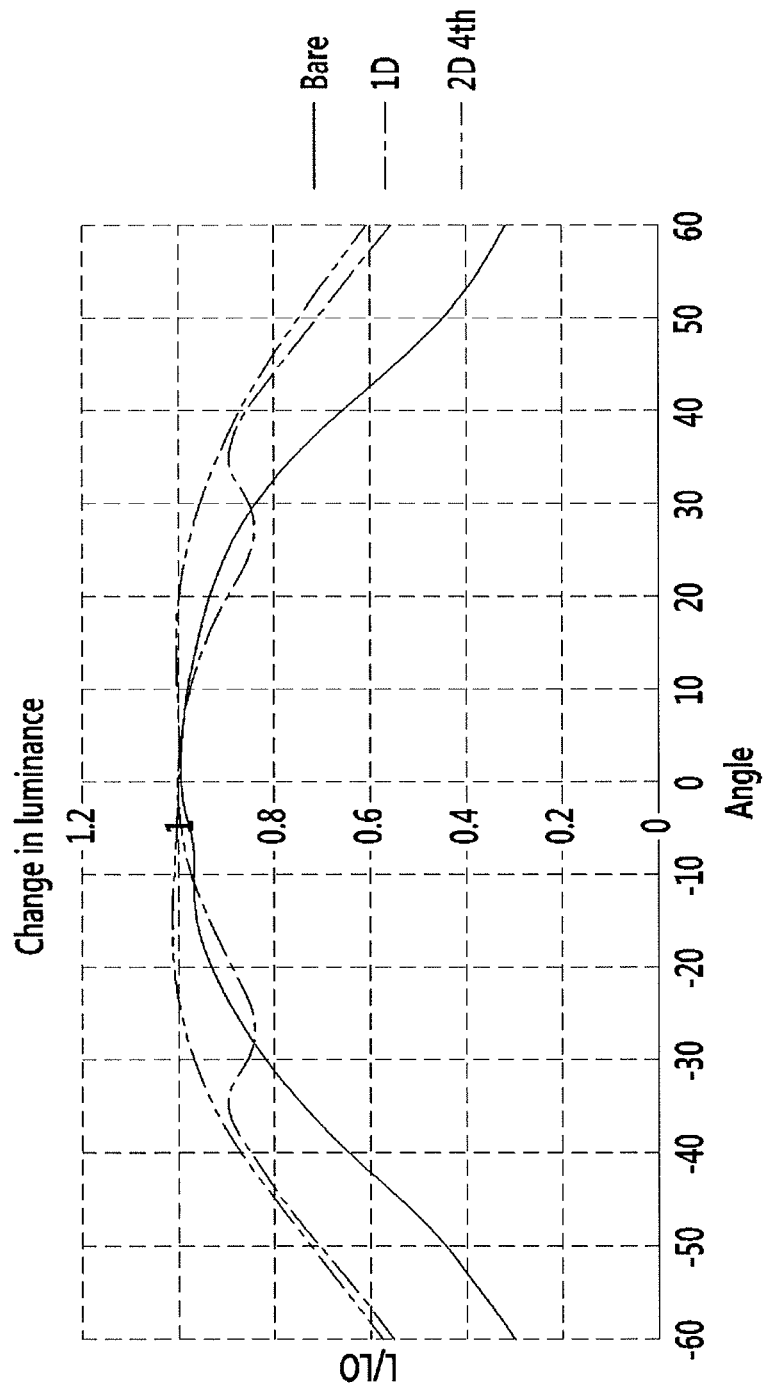
FIGS. 5 to 16 illustrate views showing an effect of the optical film according to an Example.

First, FIG. 5 illustrates a comparison of changes in luminance according to the angle in a case (bare) where there is no optical film on the entire surface of the display device, a case of the optical film (1D) having the pattern (pattern where the linear pattern longitudinally extends in one direction) arranged in only one direction, and a case of the optical film (2D 4th) having the pattern arranged in two or more directions according to an embodiment. The results of optical film according to the exemplary embodiment were calculated based on using the right structure of the striped arrangement exemplary embodiment of FIG. 3.

As seen from FIG. 5, if the optical film according to the exemplary embodiment of the present invention is used, the luminance at the lateral surface may be improved, as compared to the case where there is no optical film. Further, it may be seen that in the structure of 1D, a luminance inversion (where the luminance is reduced and then increased again as the angle is increased) may occur. According to the Example (2D 4th), the luminance may not be bent, but may be constantly changed, and thus a change characteristic of the luminance at the front surface and the upper, lower, left, and right portions may be improved.

In FIGS. 6 to 9, characteristics of white and three primary colors according to the angle are illustrated.

Figure 6:
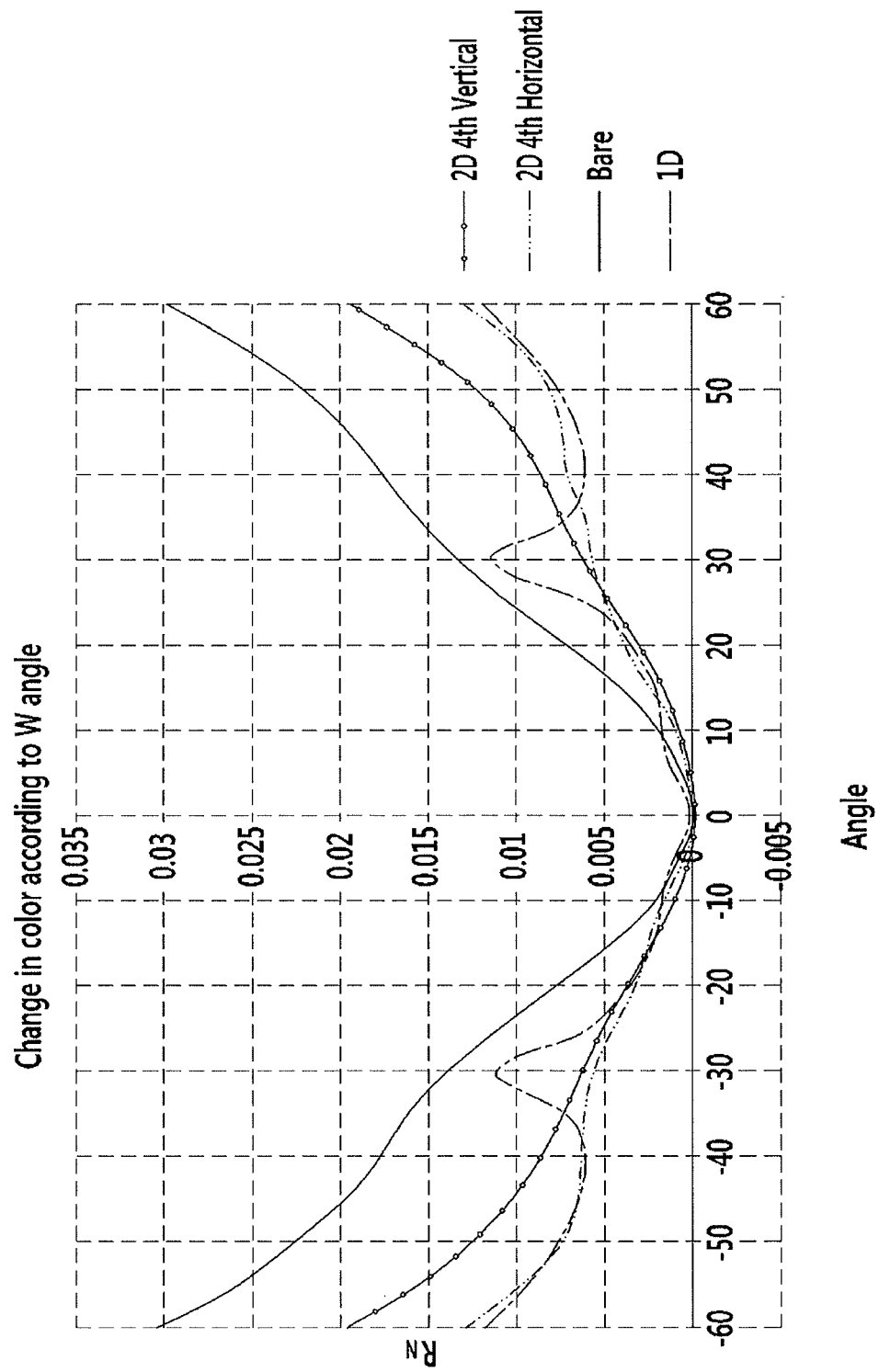

First, in FIG. 6, a change in white color is illustrated according to the angle. As seen from FIG. 6, if the optical film 250 according to the Example of the embodiment is used, there may be merits in that the change in white color according to the angle may be reduced, as compared to the case where the optical film 250 is not used. For example, rapid color change and color inversion characteristics occurring in the structure of 1D may be removed.

Figure 7:
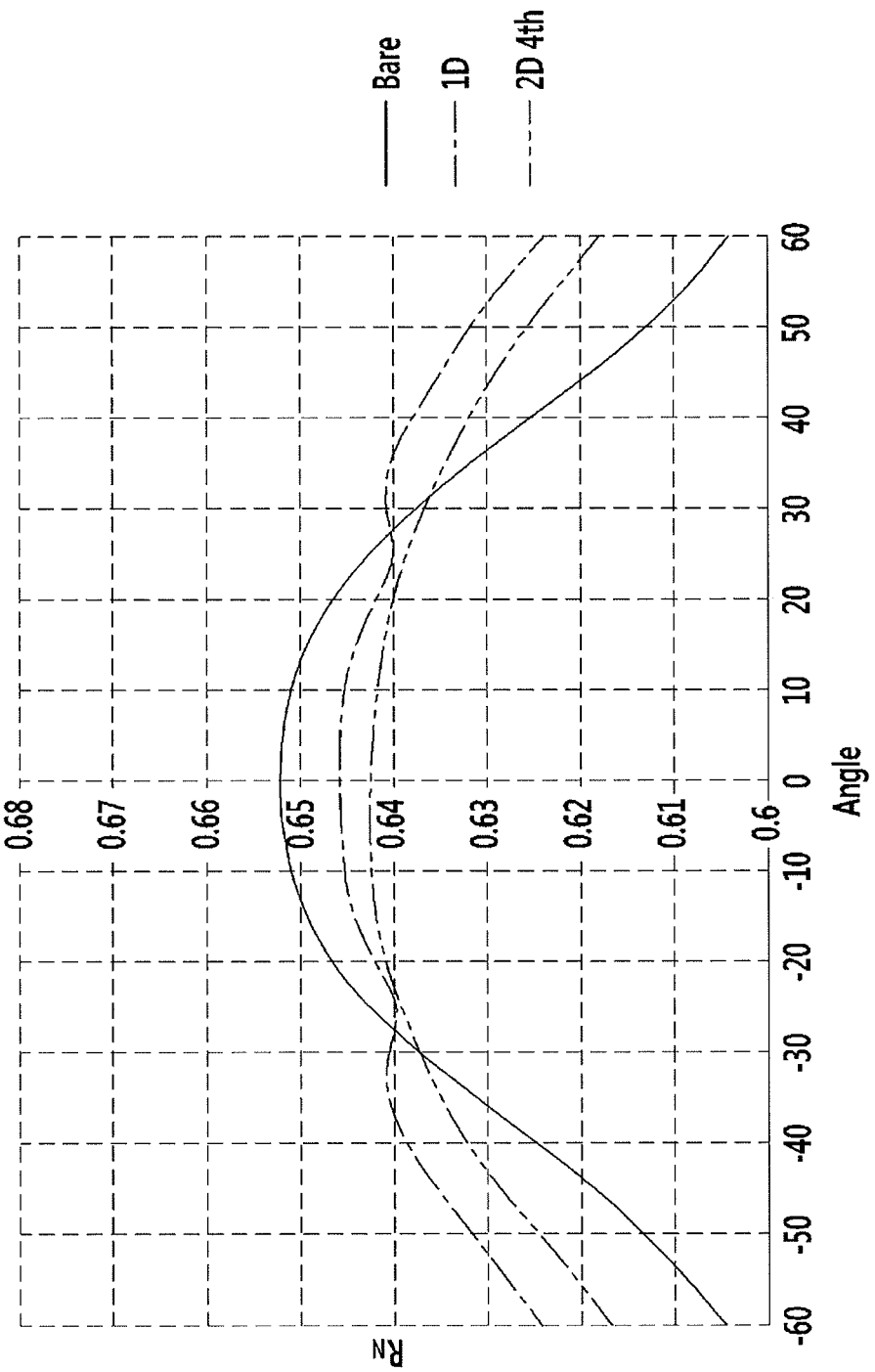
Figure 8:
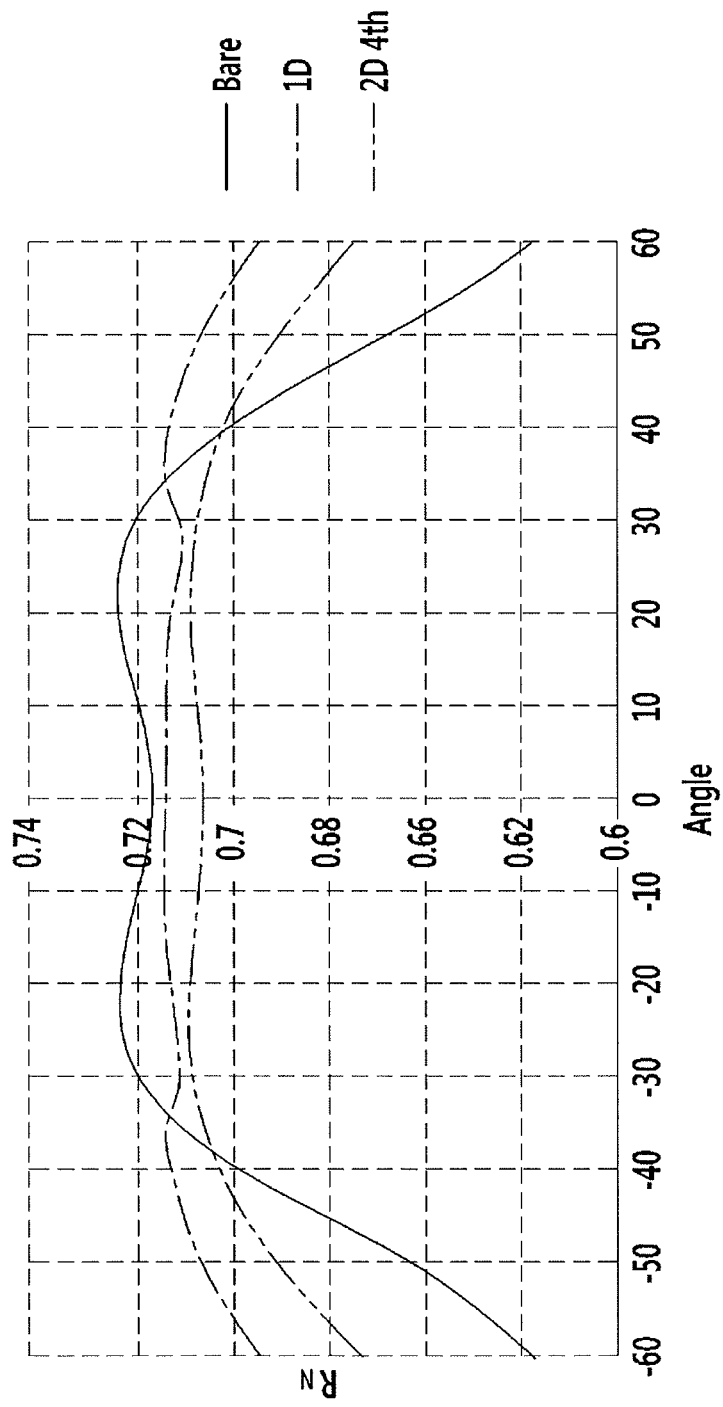
Figure 9:
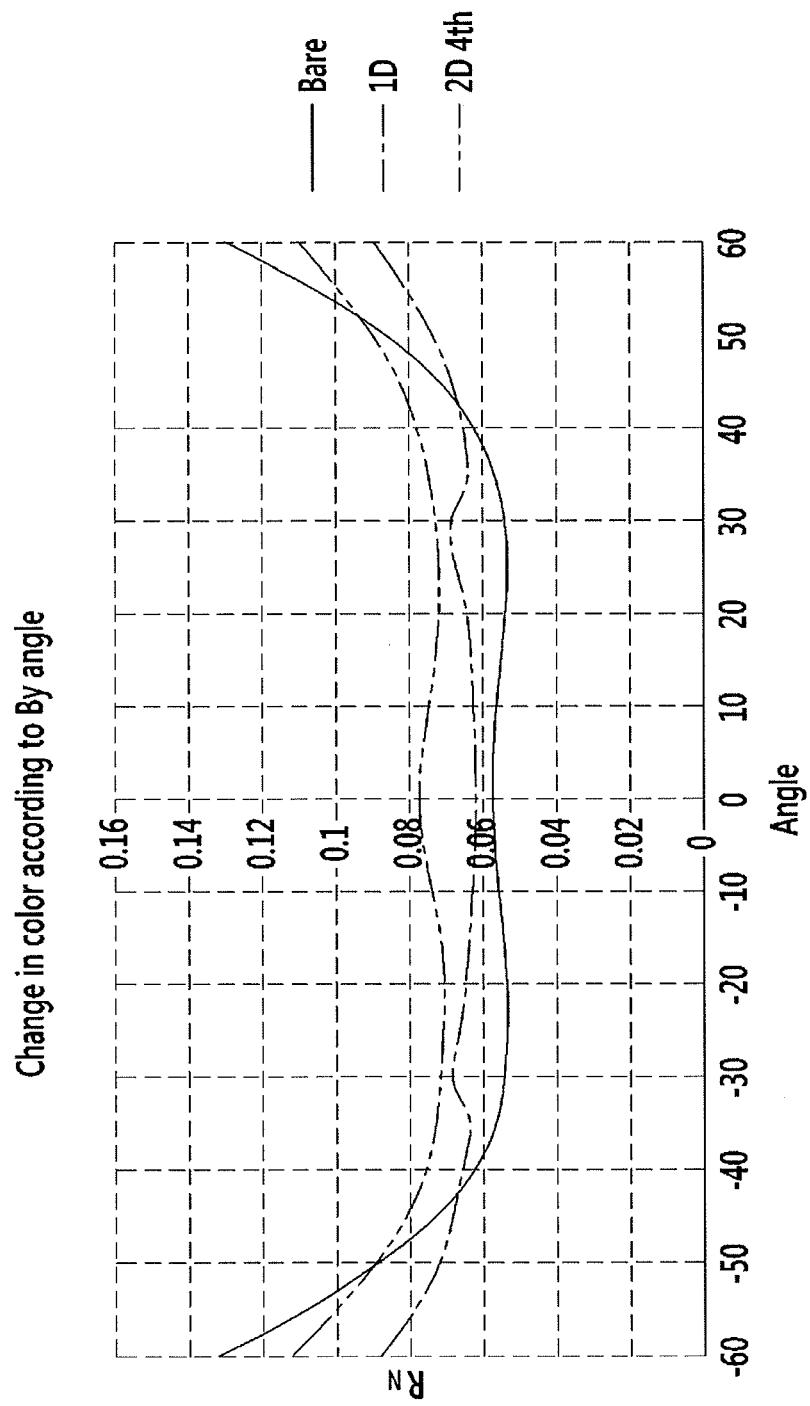

In FIG. 7, a change in red color is illustrated, in FIG. 8, a change in green color is illustrated, and in FIG. 9, a change in blue color is illustrated.

It may be seen that when the optical film 250 according to the embodiments is used, e.g., as in FIGS. 7 to 9, the color change according to the angle may be smallest.

The results of FIGS. 6 to 9 are summarized in the following Table 1.

TABLE 1

| Item | Comparative Example (Bare) | Comparative Example (1D) | Example (2D) | Example effect |
|---|---|---|---|---|
| Luminance L/L0 | 32% | 56% | 61% | Change in luminance +90% improved |

TABLE 1-continued

| Item | | Comparative Example (Bare) | Comparative Example (1D) | Example (2D) | Example effect |
| --- | --- | --- | --- | --- | --- |
| Change in white color ($\Delta$u'v') | Horizontal direction | 0.032 | 0.012 | 0.014 | Color change −57% reduced |
| | Vertical direction | 0.032 | 0.032 | 0.021 | Color change −35% reduced |

Figure 10:
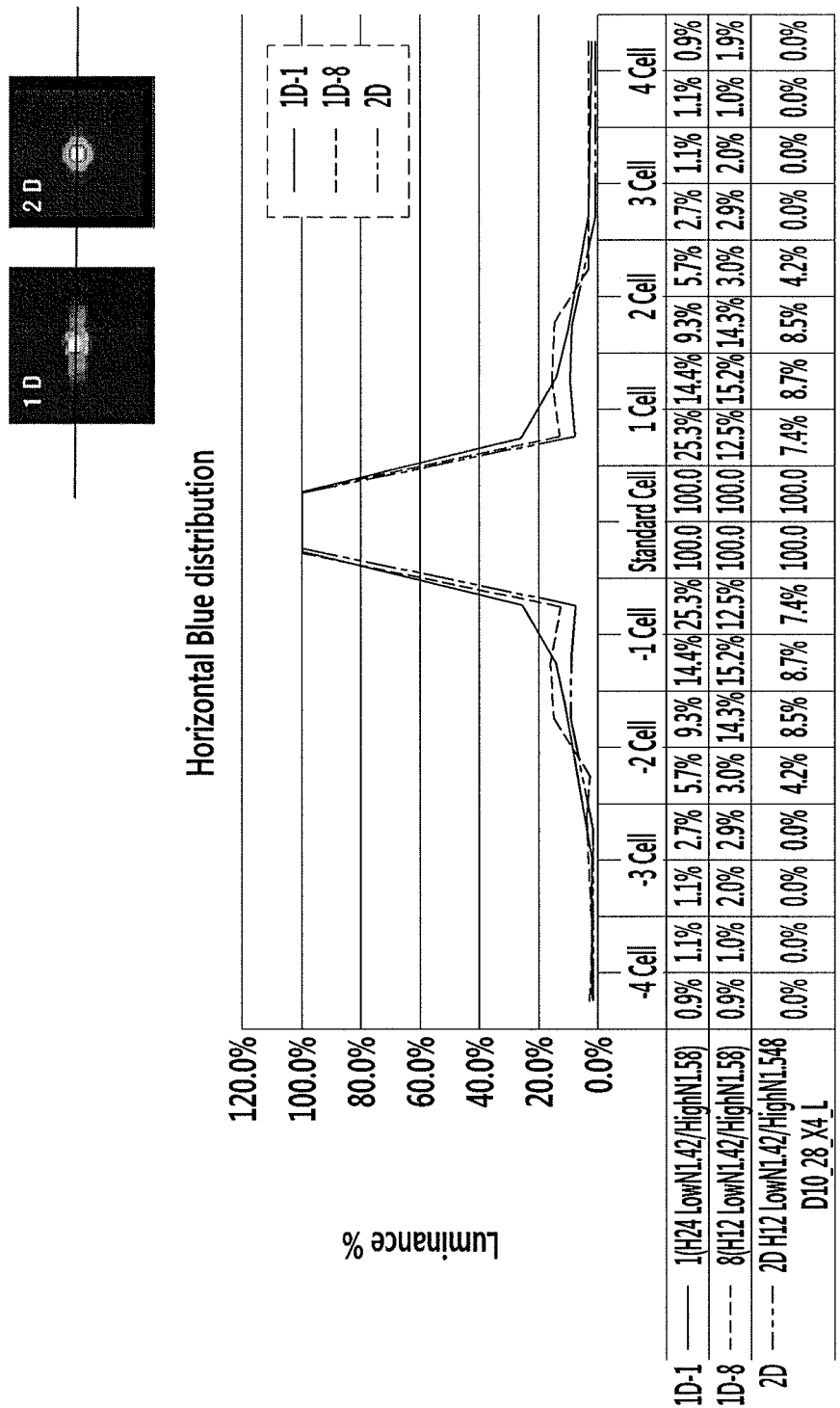

FIG. 10 illustrates a graph showing a degree of blurring due to the optical film in the case where one pixel emits light.

In FIG. 10, two Comparative Examples (1D-1 and 1D-8) and the Example (2D) according to an embodiment are shown, and while one pixel emits light, the blurring characteristic therearound was reviewed.

The Comparative Examples may have the structure where the protrusions were arranged in only one direction, and thus may have a characteristic that blurring occurred in the corresponding direction. However, in the structure according to the Example (2D) of the embodiments, it may be seen that light may be uniformly dispersed to the front surface and the upper, lower, left, and right portions by the protrusions arranged in at least two directions, and thus blurring to the peripheral pixel may not occur. This characteristic may have a merit in that the Example may be used in the display device having a high resolution.

Figure 11:
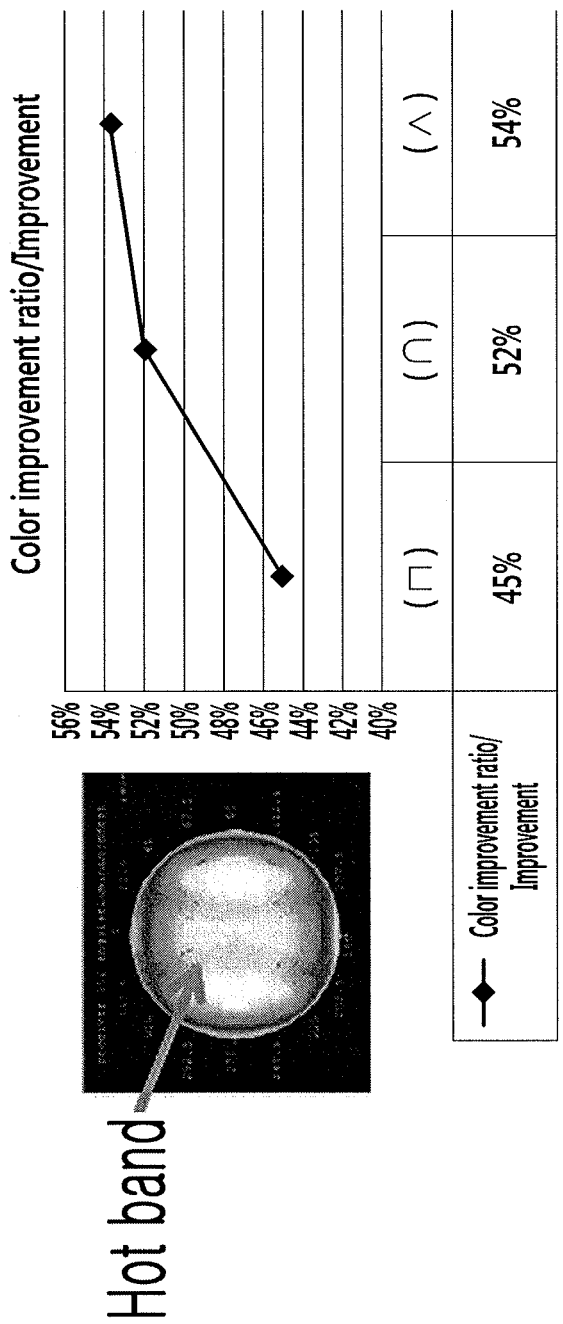

FIG. 11 illustrates a view of a color improvement ratio according to a structure of an end of a single protrusion. As shown in FIG. 11, a cross-section of the tested protrusion may be a rectangular cross-sectional structure, a rounded cross-sectional structure, and a triangular cross-sectional structure.

The color improvement ratio to each cross-sectional structure is illustrated in FIG. 11. It may be seen that the color improvement ratio may be changed according to the structure of the protrusion. For example, the sharper an upper portion of the protrusion, the higher the color improvement ratio. However, as illustrated in FIG. 11, there may be a drawback in that there may be a high probability of occurrence of a hot band at a color boundary. Therefore, the structure of the protrusion suitable to the Example may be selected and used. In order to remove or in consideration of the hot band, the diffusion material may be included, or an additional diffusion film may be used to reduce the hot band. The merit of the color improvement ratio may be included and the merit of the hot band may be reduced by forming the rounded upper portion (unlike the triangular cross-sectional structure) while the upper portion of the protrusion is made sharp.

Figure 12:
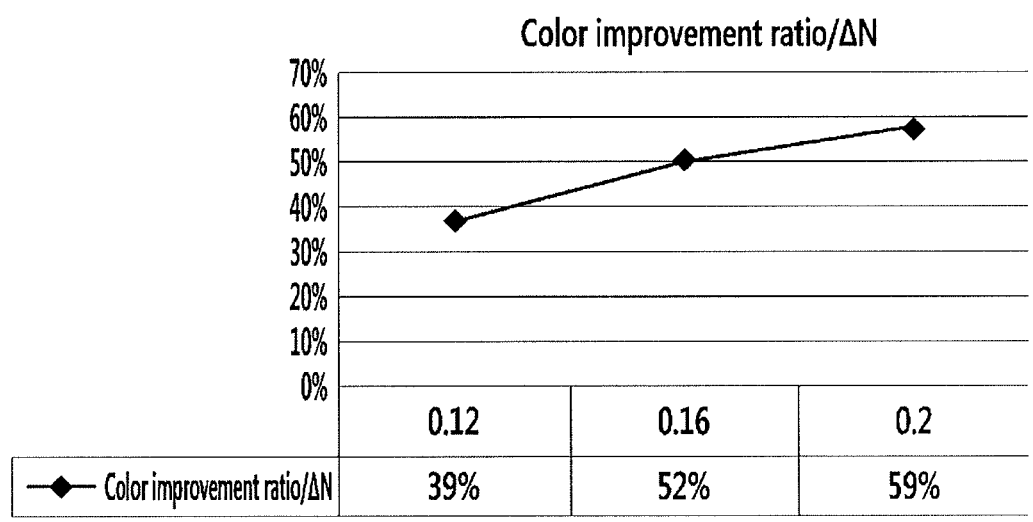

FIG. 12 illustrates a graph showing a color improvement ratio according to a difference ($\Delta$N) between the refractive indexes of the first refractive index layer and the second refractive index layer.

The color improvement ratio was reviewed through cases in which the same protrusion pattern is provided and the difference between the refractive indexes of the first refractive index layer and the second refractive index layer was 0.12, 0.16, and 0.2. According to FIG. 12, it may be seen that the color improvement ratio may be increased as the difference between the refractive indexes increased. Accordingly, formation of the first refractive index layer and the second refractive index layer by using a resin material having a refractive index difference that is as large as possible may be desirable for the color improvement ratio. According to an embodiment, the refractive index difference may be 0.2 or less.

Figure 13:
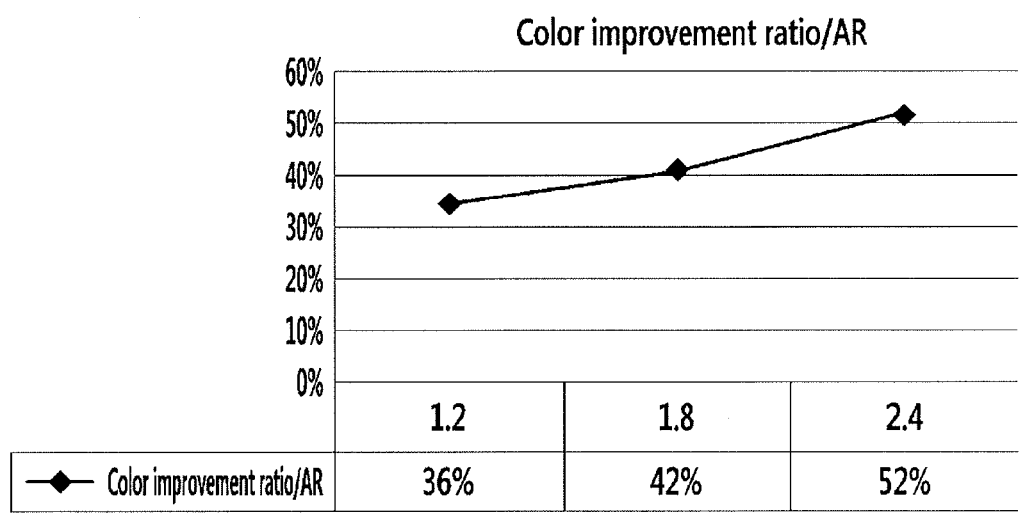

FIG. 13 illustrates a graph showing a difference between color improvement ratios according to the aspect ratio (AR; ratio of a height to a width) of the protrusion shape.

FIG. 13 illustrates a change in color improvement ratio based on only 1.2, 1.8, and 2.4, which were aspect ratios (ratios of a height to a width) of the protrusion shape. According to FIG. 13, the color improvement ratio may be increased as the aspect ratio increased, and the higher the aspect ratio of the protrusion shape, the better the color improvement ratio may be, and the aspect ratio of the protrusion used in the optical film according to the exemplary embodiment may be sufficient if the aspect ratio (ratio of a height to a width) was 0.5 or more.

Figure 14:
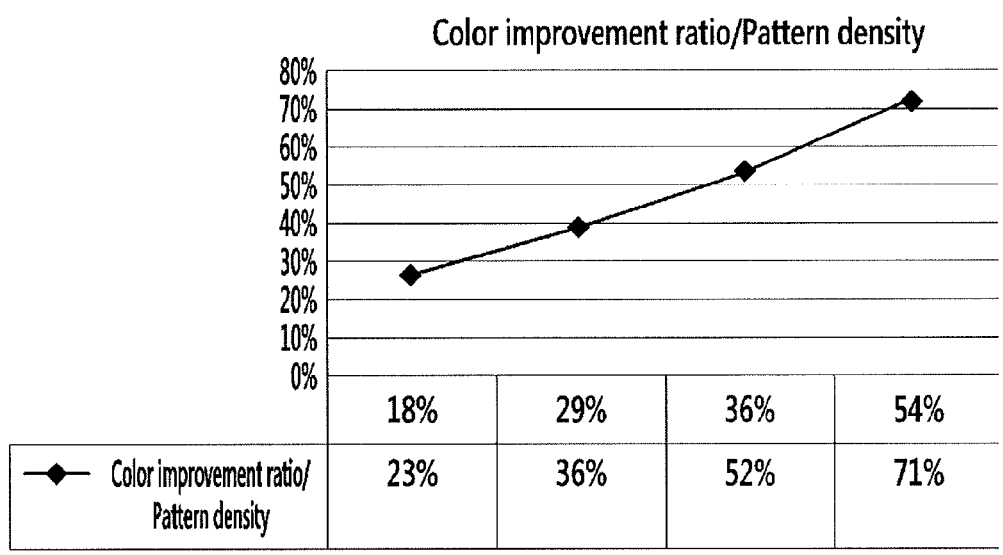

FIG. 14 illustrates a difference between color improvement ratios according to a density of the protrusion pattern. Herein, the pattern density was determined based on a lower portion (widest portion) of the protrusion.

In FIG. 14, the color improvement ratios were compared based on the density of 18%, 29%, 36%, and 54%, and it may be seen that the color improvement ratio may be increased as the pattern density increased. However, in the case where the pattern density was very high, there may be a phenomenon of color shifting and a reduction in transmittance. Accordingly, in the optical film according to the exemplary embodiment, the pattern density of the protrusion may be 90% or less.

Figure 15:
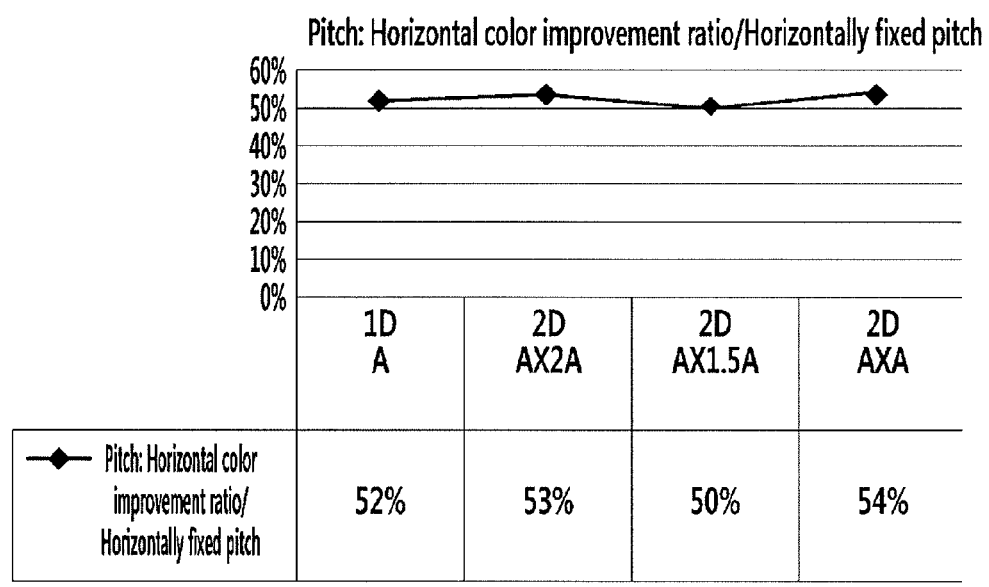
Figure 16:
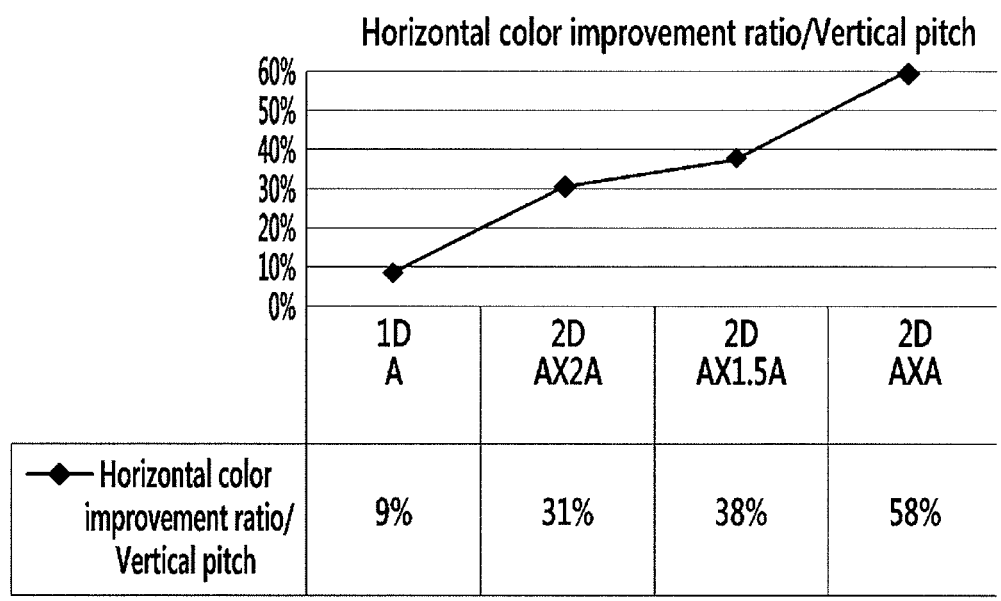

FIGS. 15 and 16 illustrate a color improvement ratio according to a difference between pitches of the protrusion pattern. FIGS. 15 and 16 illustrate the structure where the pattern longitudinally extends in one direction and the line width (horizontal pitch) thereof is A μm as the 1D pattern that is the Comparative Example, and the Example where the protrusion has a line width of A μm and a length (vertical pitch) of 2A (two times of A) μm, the Example where the protrusion has the line width of A μm and the length of 1.5A (1.5 times of A) μm, and the Example where the protrusion has the line width of A μm and the length of A μm as the protrusion pattern (2D) according to the exemplary embodiment. Herein, A may be one of values of 10 or more and 100 or less.

In FIG. 15 illustrating a horizontal color improvement ratio, all the line widths are A μm, it may be seen that the color improvement ratios may be almost similar to each other. However, in FIG. 16 (e.g., a vertical color improvement ratio), it may be seen that the color improvement ratio may be reduced as the length of the protrusion was reduced.

Therefore, it may be seen that if the pitches were the same as each other, the color improvement ratios may be the same as each other, and the color improvement ratio may be increased as the pitch was reduced. Further, it may be seen that a ratio of the horizontal pitch (line width) to the vertical pitch (length) and the vertical color improvement ratio may have a proportional relationship.

Until now, trends of the color improvement ratio according to various conditions are described.

Hereinafter, measured values and calculated values of the color improvement ratio of the optical film after the optical film actually having a specific protrusion pattern was actually manufactured will be compared.

Figure 17B:
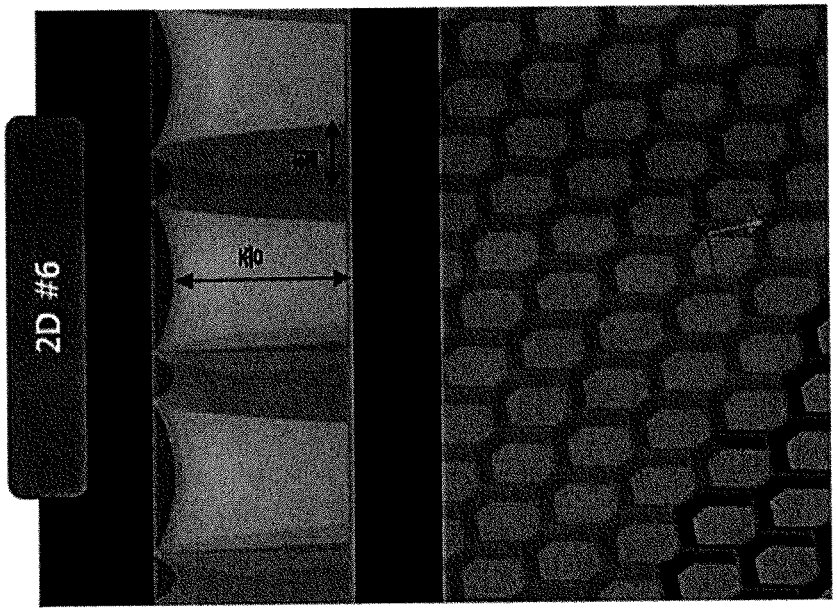
FIGS. 17A and 17B illustrates an image showing a cross-section and a top plan of the optical film actually manufactured according to the exemplary embodiment.
Figure 17A:
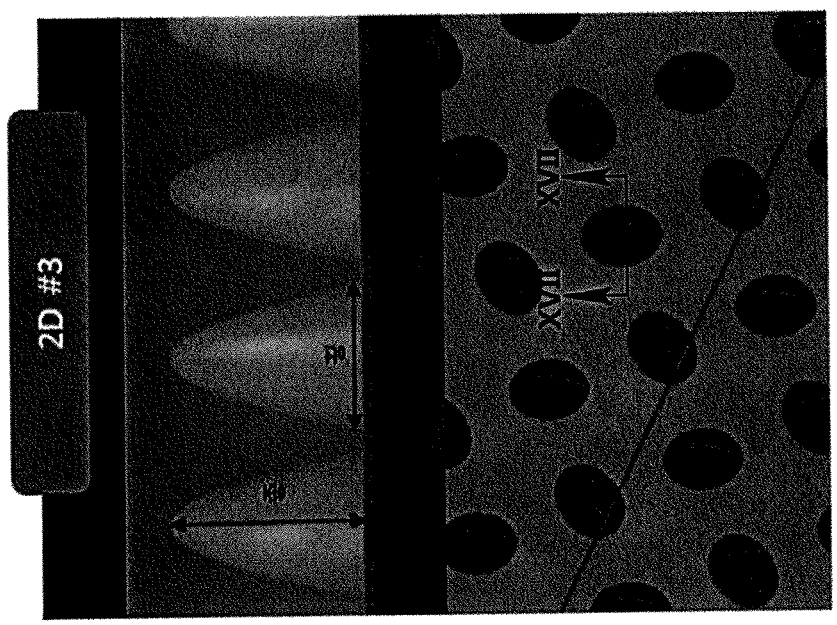

FIGS. 17A and 17B illustrate structures of two additional Examples.

First, the Example of 2D #3 is an Example having an oval structure in the top plan view and a structure having a circular or rounded cross-section and a width reduced toward an upper portion in the cross-sectional view. In the Example of 2D #3 of FIG. 17, the line XVII-XVII is illustrated, which means where the cross section is made. As illustrated in the Example of 2D #3 of FIG. 17, the width of the protrusion is selected as the narrowest value. In addition, the widest width of the protrusion may be smaller than a length of a pixel.

The Example of 2D #6 had a hexagonal structure in the top plan view, and a pillar structure having a width increased toward an upper portion in the cross-sectional view. The hexagonal structure in the top plan view is also called a honeycomb pattern.

Among the two Examples, the actually measured color improvement ratio value and the calculated color improvement ratio value of 2D #3 are described in the following Table 2.

TABLE 2

| Classification | | $\Delta N$ | Aspect ratio | Measurement angle | Actually measured color improvement ratio | Calculated color improvement ratio | Error |
|---|---|---|---|---|---|---|---|
| 2D #3 | Horizontal | 0.16 | 1.6 16/10 | 60° | 0.022 | 0.0241 | 7% |
| | Vertical | 0.16 | 1.6 16/10 | 60° | 0.021 | 0.0243 | 11% |

As shown in Table 2, it may be seen that in the case where the optical film was actually manufactured, an error occurred, and thus the color improvement ratio was reduced. However, it may be seen that this level of the color improvement ratio was an improved color improvement ratio, in consideration of the Comparative Example of 1D where the color improvement ratio was generally about 0.012.

In the Example of 2D #6, the experimental color improvement ratio was reduced by about 5%, as compared to the calculated value. However, it may be seen that this also exhibited the high color improvement ratio, as compared to the Comparative Example.

Therefore, the optical film like the Example may have a merit in that the protrusion patterns may be arranged in at least two directions to help reduce the difference between the luminances and the difference between the colors at the front surface and the upper, lower, left, and right portions.

Hereinafter, a method of manufacturing the optical film according to the exemplary embodiment will be described through FIGS. 18 and 19.

Figure 18:
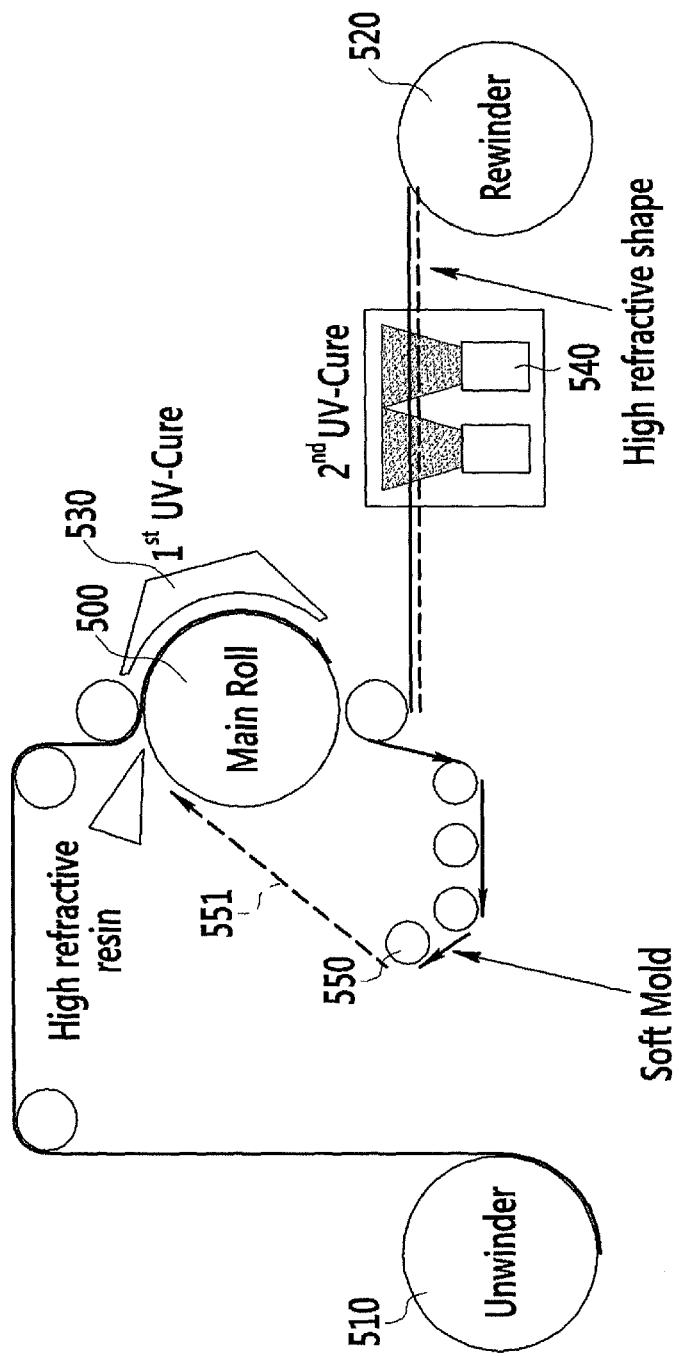

FIGS. 18 and 19 illustrate views sequentially showing a process of manufacturing the optical film according to the exemplary embodiment.

First, FIG. 18 illustrates a method of manufacturing the second refractive index layer 252 having the intaglioed protrusion pattern.

The resin material of the high refractive index may be provided to a main roller 500, and a soft mold 551 (on which the protrusion pattern is formed) may be connected in a belt type to a surface of the main roller 500. For example, the soft mold 551 may have a shape of a belt connected to the main roller 500 so that the soft mold 551 rotates by a roller 550 for the soft mold, and the protrusion pattern may be formed on a surface of the belt. A high refractive index resin material may be modified into a structure where the protrusion pattern is intaglioed by the soft mold 551, and receives ultraviolet rays irradiated by a first UV ray irradiator 530 to be primarily cured. Thereafter, the high refractive index resin material may be separated from the soft mold 551, secondarily cured through a second UV ray irradiator 540, and transported to a roller 520. The secondarily cured layer transported to the roller 520 may be the high refractive index layer 252.

According to FIG. 19, the roller 520 may transport the high refractive index layer 252 (provided to the roller 520) to a hard mold 501 to which the low refractive index resin is provided by reversing a rotation direction. In the hard mold 501, the intaglioed protrusion pattern of the high refractive index layer 252 is filled with the low refractive index resin. As a result, the low refractive index layer 251 having the protrusion pattern is formed, primarily cured by a third UV ray irradiator 531, and secondarily cured by a fourth UV ray irradiator 541 to complete the optical film 250.

The support layer 253 may be positioned on one side of the optical film 250, and the support layer 253 may be attached after the low refractive index layer 251 and the high refractive index layer 252 are completed, or may be attached in advance when the high refractive index layer 252 is formed in FIG. 18. In the case where the support layer 253 is attached in advance when the high refractive index layer 252 is formed in FIG. 18, the protrusion pattern may be formed to be intaglioed in the high refractive index resin by the soft mold in a state where the support layer is formed on one surface of the high refractive index resin.

The low refractive index material may be well filled in the intaglioed protrusion pattern (as compared with the high refractive index material), and the formation may be performed in the aforementioned order.

In FIGS. 18 and 19, in the protrusion pattern, the plurality of protrusions may be arranged in at least two directions, and the aspect ratio (ratio of a height to a width) of the protrusion may be 0.5 or more.

By way of summation and review, in the non-emissive display device or the self-luminous display device, a constant image quality may be secured even at various positions. For example, in order to achieve an equivalent information display in all directions of a front surface and upper, lower, left, and right directions, a continuous improvement may be required, and as a result, a constant level of image quality may be provided in various directions even in a display having a curved surface.

The embodiments may provide an optical film that is capable of improving a difference between luminances and a difference between colors of a front surface and upper, lower, left, and right portions of a display device at the same level.

According to an embodiment, it is possible to watch a display device with the same image quality even at various positions by using an optical film that helps reduce a difference between luminances and a difference between colors of a front surface and upper, lower, left, and right portions of the display device on an entire surface of the display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

<Description of symbols>

| | |
|---|---|
| 100: Lower substrate | 190: Pixel electrode |
| 200: Capping glass | 250: Optical film |
| 251: First refractive index layer | 252: Second refractive index layer |
| 253: Support layer | 270: Common electrode |
| 310: Organic emission layer | 500: Main roller |
| 501: Hard mold | 520: Roller |
| 530, 531, 540, 541: UV ray irradiator | |
| 550: Roller for soft mold | 551: Soft mold |

What is claimed is:

1. An optical film, comprising:
a first refractive index layer including a plurality of protrusions;
a second refractive index layer covering the plurality of protrusions, the second refractive index layer having a refractive index that is different from a refractive index of the first refractive index layer; and
a support layer on the first refractive index layer or the second refractive index layer,
wherein a ratio of a height to a width of the protrusion is greater than 2.0, and
wherein the first refractive index layer further includes a connection portion connecting the plurality of protrusions, the protrusions and the connection portion protruding into the second refractive index layer and the plurality of protrusions extending outwardly at sides of the connection portion.

2. The optical film as claimed in claim 1, wherein a difference between the refractive index of the first refractive index layer and the refractive index of the second refractive index layer is 0.2 or less.

3. The optical film as claimed in claim 2, wherein a density of the plurality of protrusions is 90% or less.

4. The optical film as claimed in claim 3, wherein:
a higher refractive index layer of the first refractive index layer and the second refractive index layer includes:
about 20 to about 50% of epoxy acrylate,
about 50 to about 80% of an acrylate monomer, and
about 1 to about 6% of a photoinitiator, and
a lower refractive index layer of the first refractive index layer and the second refractive index layer includes:
about 20 to about 60% of fluorine urethane acrylate,
about 20 to about 60% of a fluorine acrylate monomer,
about 10 to about 40% of an acrylate monomer, and
about 1 to about 6% of a photoinitiator.

5. The optical film as claimed in claim 3, wherein each protrusion has a shape of any one of a polygon, a circle, an oval, a quadrangle, a rhombus, or a diamond.

6. The optical film as claimed in claim 3, wherein at least one of the first refractive index layer or the second refractive index layer further includes a diffusion agent.

7. The optical film as claimed in claim 1, wherein each protrusion has a shape of any one of a polygon, a circle, an oval, a quadrangle, a rhombus, or a diamond.

8. A display device, comprising:
a display panel; and
an optical film on an entire surface of the display panel, wherein the optical film includes:
a first refractive index layer including a plurality of protrusions;
a second refractive index layer covering the plurality of protrusions, the second refractive index layer having a refractive index that is different from a refractive index of the first refractive index layer; and
a support layer outside the first refractive index layer or the second refractive index layer,
wherein a ratio of a height to a width of the protrusion is greater than 2.0, and
wherein the first refractive index layer further includes a connection portion connecting the plurality of protrusions, the protrusions and the connection portion protruding into the second refractive index layer and the plurality of protrusions extending outwardly at sides of the connection portion.

9. The display device as claimed in claim 8, wherein a difference between the refractive index of the first refractive index layer and the refractive index of the second refractive index layer is 0.2 or less.

10. The display device as claimed in claim 9, wherein a density of the plurality of protrusions is 90% or less.

11. The display device as claimed in claim 10, wherein:
a higher refractive index layer of the first refractive index layer and the second refractive index layer includes:
about 20 to about 50% of epoxy acrylate,
about 50 to about 80% of an acrylate monomer, and
about 1 to about 6% of a photoinitiator, and
a lower refractive index layer of the first refractive index layer and the second refractive index layer includes:
about 20 to about 60% of fluorine urethane acrylate,
about 20 to about 60% of a fluorine acrylate monomer,
about 10 to about 40% of an acrylate monomer, and
about 1 to about 6% of a photoinitiator.

12. The display device as claimed in claim 10, wherein each protrusion has a shape of any one of a polygon, a circle, an oval, a quadrangle, a rhombus, or a diamond.

13. The display device as claimed in claim 10, wherein at least one of the first refractive index layer or the second refractive index layer further includes a diffusion agent.

14. The display device as claimed in claim 10, wherein:
in the display panel, each pixel includes an organic emission layer, and
the organic emission layer emits light of any one of three primary colors of light.

15. The optical film as claimed in claim 8, wherein each protrusion has a shape of any one of a polygon, a circle, an oval, a quadrangle, a rhombus, or a diamond.

16. A method of manufacturing an optical film, the method comprising:
- forming a high refractive index layer in which a plurality of protrusions is intaglioed by providing a high refractive index resin to a soft mold in which the plurality of protrusions is formed; and
- forming a low refractive index layer by providing a low refractive index resin to the intaglioed plurality of protrusions to perform filling,
- wherein a ratio of a height to a width of the protrusion is greater than 2.0, and
- wherein the high refractive index layer further includes a connection portion connecting the plurality of protrusions, the protrusions and the connection portion protruding into the low refractive index layer and the plurality of protrusions extending outwardly at sides of the connection portion.

17. The method as claimed in claim 16, further comprising forming a support layer on the high refractive index layer or the low refractive index layer.

18. The method as claimed in claim 17, wherein, in the forming of the high refractive index layer, the plurality of protrusions is intaglioed in the high refractive index resin by the soft mold in a state where the support layer is formed on one surface of the high refractive index resin.

* * * * *